United States Patent
Sahin et al.

(10) Patent No.: US 6,379,466 B1
(45) Date of Patent: Apr. 30, 2002

(54) TEMPERATURE CONTROLLED GAS DISTRIBUTION PLATE

(75) Inventors: Turgut Sahin, Cupertino; Salvador Umotoy, Antioch; Avi Tepman, Cupertino; Ronald Lloyd Rose, Los Gatos, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/238,598

(22) Filed: May 5, 1994

Related U.S. Application Data (63) Continuation of application No. 07/822,398, filed on Jan. 17, 1992, now abandoned.

(51) Int. Cl.[7] .................... C23C 16/00; C23C 14/00; F28F 3/12
(52) U.S. Cl. ............... 118/724; 118/715; 204/298.09; 165/168; 165/169; 165/80.4
(58) Field of Search ............... 165/80.4, 48.1, 165/154, 164, 169, 643, 168; 118/725, 715, 724; 437/180; 156/345; 204/298.09

(56) References Cited

U.S. PATENT DOCUMENTS

| | | | |
|---|---|---|---|
| 1,213,349 A | * 1/1917 | Gebhard et al. | ............ 165/164 |
| 3,534,813 A | * 10/1970 | Fleming | ............ 165/164 |
| 4,096,910 A | * 6/1978 | Coffinberry et al. | ........ 165/154 |

(List continued on next page.)

FOREIGN PATENT DOCUMENTS

| EP | 0364215 | 4/1990 | ............ 315/111.21 |
|---|---|---|---|
| EP | 0444253 | * 9/1991 | ................ 118/715 |
| GB | 1009178 | * 11/1965 | ................ 165/164 |
| JP | 0102030 | * 5/1986 | ................ 118/725 |
| JP | 0163640 | 7/1986 | ................ 156/345 |
| JP | 61208222 | 9/1986 | |
| JP | 3310118 | * 12/1988 | ................ 118/725 |
| JP | 1-149964 | 6/1989 | ................ 118/723 |
| JP | 0287923 | * 11/1989 | ................ 165/80.4 |
| JP | 62-17594 | 1/1997 | |

*Primary Examiner*—John K. Ford
(74) *Attorney, Agent, or Firm*—Moser Patterson & Sheridan, LLP

(57) ABSTRACT

The temperature controlled gas distribution plate of the present invention includes a liquid cooling passage, with inlet and outlet ports, that is formed within the gas distribution plate. In the preferred embodiment, the plate is formed with an upper passage cover and a lower base having a liquid passage channel formed within the side walls thereof. The cover and base are welded together to form a sealed liquid passage within the plate through which the liquid coolant flows.

2 Claims, 5 Drawing Sheets

U.S. PATENT DOCUMENTS

| | | | |
|---|---|---|---|
| 4,134,817 A | | 1/1979 | Bourdon ..................... 156/643 |
| 4,209,357 A | | 6/1980 | Gorin et al. ................. 156/643 |
| 4,361,284 A | * | 11/1982 | Kalbskopf et al. ........... 118/725 |
| 4,436,584 A | | 3/1984 | Bernacki et al. ............ 156/345 |
| 4,446,815 A | * | 5/1984 | Kalbskopf et al. .......... 118/725 |
| 4,512,391 A | * | 4/1985 | Harra ........................ 165/48.1 |
| 4,595,484 A | | 6/1986 | Giammarco et al. ........ 156/643 |
| 4,612,077 A | | 9/1986 | Tracey et al. ................ 156/643 |
| 4,630,669 A | * | 12/1986 | Kessler et al. .............. 165/169 |
| 4,820,371 A | | 4/1989 | Rose ..................... 118/728 X |
| 4,834,020 A | * | 5/1989 | Bartholomew et al. ..... 118/725 |
| 4,849,068 A | | 7/1989 | Davis et al. ................ 156/643 |
| 4,859,304 A | | 8/1989 | Cathey et al. ............... 156/345 |
| 4,872,947 A | * | 10/1989 | Wang et al. ................ 156/345 |
| 4,908,095 A | * | 3/1990 | Kagatsume et al. ........ 156/345 |
| 4,931,135 A | | 6/1990 | Horiuchi et al. ............ 156/646 |
| 4,960,488 A | | 10/1990 | Law et al. .......... 204/798.33 X |
| 4,981,722 A | * | 1/1991 | Möller et al. ................ 156/345 |
| 5,006,220 A | | 4/1991 | Hijikata et al. ......... 156/345 X |
| 5,009,738 A | | 4/1991 | Gruenwald et al. ......... 156/345 |
| 5,013,400 A | * | 5/1991 | Kurasaki et al. ............ 156/345 |
| 5,019,531 A | * | 5/1991 | Awaya ....................... 437/180 |
| 5,029,640 A | * | 7/1991 | Niggemann ................. 165/164 |
| 5,034,688 A | * | 7/1991 | Moulene et al. ........... 165/80.4 |
| 5,074,456 A | * | 12/1991 | Degner ....................... 156/345 |
| 5,134,965 A | * | 8/1992 | Tokuda et al. .............. 156/345 |
| 5,136,975 A | | 8/1992 | Bartholomew et al. ..... 118/715 |
| 5,200,232 A | * | 4/1993 | Tappan et al. .............. 118/725 |
| 5,316,796 A | | 5/1994 | Awaya et al. | 
| 5,453,124 A | * | 9/1995 | Moslehi et al. ............. 118/725 |
| 5,462,014 A | * | 10/1995 | Awaya et al. ............... 118/725 |

* cited by examiner

TEMPERATURE CONTROLLED GAS DISTRIBUTION PLATE

This application is a continuation of application Ser. No. 07/822,398, filed Jan. 17, 1992, now abandoned.

BACKGROUND OF THE INVENTION

1. Field of the Invention

The present invention relates generally to gas distribution plates utilized in semiconductor wafer processing equipment, and more particularly to a liquid cooled gas distribution plate for use in chemical vapor deposition chambers.

2. Brief Description of the Prior Art

Gas distribution plates are commonly utilized in chemical vapor deposition (CVD) chambers to uniformly distribute the gas upon its introduction into the chamber. Such a uniform gas distribution is necessary to achieve uniform deposition characteristics upon the surface of a wafer located within the chamber.

Problems have arisen in utilizing the currently available gas distribution plates when the temperature of the plate causes unwanted reactions between components of the deposition gas. A particular instance in which such problems have arisen concerns the deposition of tungsten silicide upon a wafer. Specifically, to deposit a layer of tungsten silicide, the two gases, tungsten hexafluoride and silane, are inletted through a manifold and mixed in a water cooled gas mixing chamber within the manifold head. The cooling is necessary because the two gases will react to form a solid, tungsten silicide, at temperatures greater than approximately 25 degrees centigrade. After mixing in the cooled manifold head, the gaseous mixture is passed through the standard gas distribution plate system, whereby a uniform distribution of the gaseous mixture is introduced into the deposition chamber. The gaseous mixture then impinges upon a warmed wafer within the chamber, whereupon the two gases react to deposit tungsten silicide upon the wafer.

Particulate contamination problems have occurred in the above described systems when the prior art gas distribution plate has warmed to temperatures greater than 25 degrees centigrade. When such plate warming occurs, the two gases react at the gas distribution plate to form large particulates which clog the gas distribution holes of the plate. Additionally, a layer of tungsten silicide may form on the inner surface of the plate to later flake off in large particulates which rain down upon the wafer to create an uneven tungsten silicide layer, whereby the wafer is contaminated and rendered valueless. The inventors are not aware of any prior art gas distribution plates that are designed to solve this problem. Of course, similar problems may exist with other gases and/or gaseous mixtures where the temperature of the gas distribution plate causes unwanted gaseous reactions.

SUMMARY OF THE INVENTION

The temperature controlled gas distribution plate of the present invention includes a liquid cooling passage, with inlet and outlet ports, that is formed within the gas distribution plate. In the preferred embodiment, the plate is formed with an upper passage cover and a lower base having a liquid passage channel formed within the side walls thereof. The cover and base are welded together to form a sealed liquid passage within the plate through which the liquid coolant flows.

It is an advantage of the present invention that the temperature of the gas distribution plate can be controlled.

It is another advantage of the present invention that gaseous reactions are inhibited from occurring at the gas distribution plate.

It is a further advantage of the present invention that particulate contamination of wafers in a CVD chamber can be minimized.

It is yet another advantage of the present invention that the clogging of holes in the gas distribution plate through the unwanted reaction of gases passing through the plate can be eliminated.

It is yet a further advantage of the present invention that it is fabricated to be engaged to a base plate that possesses substantially the same outer dimensions as existing base plates, whereby it may be retrofit into existing CVD chambers to improve the performance of such chambers.

These and other features and advantages of the present invention will no doubt become apparent to those of ordinary skill in the art after having read the following detailed description of the preferred embodiment which are illustrated in the several figures of the drawing.

DETAILED DESCRIPTION OF THE PREFERRED EMBODIMENT

Figure 1:
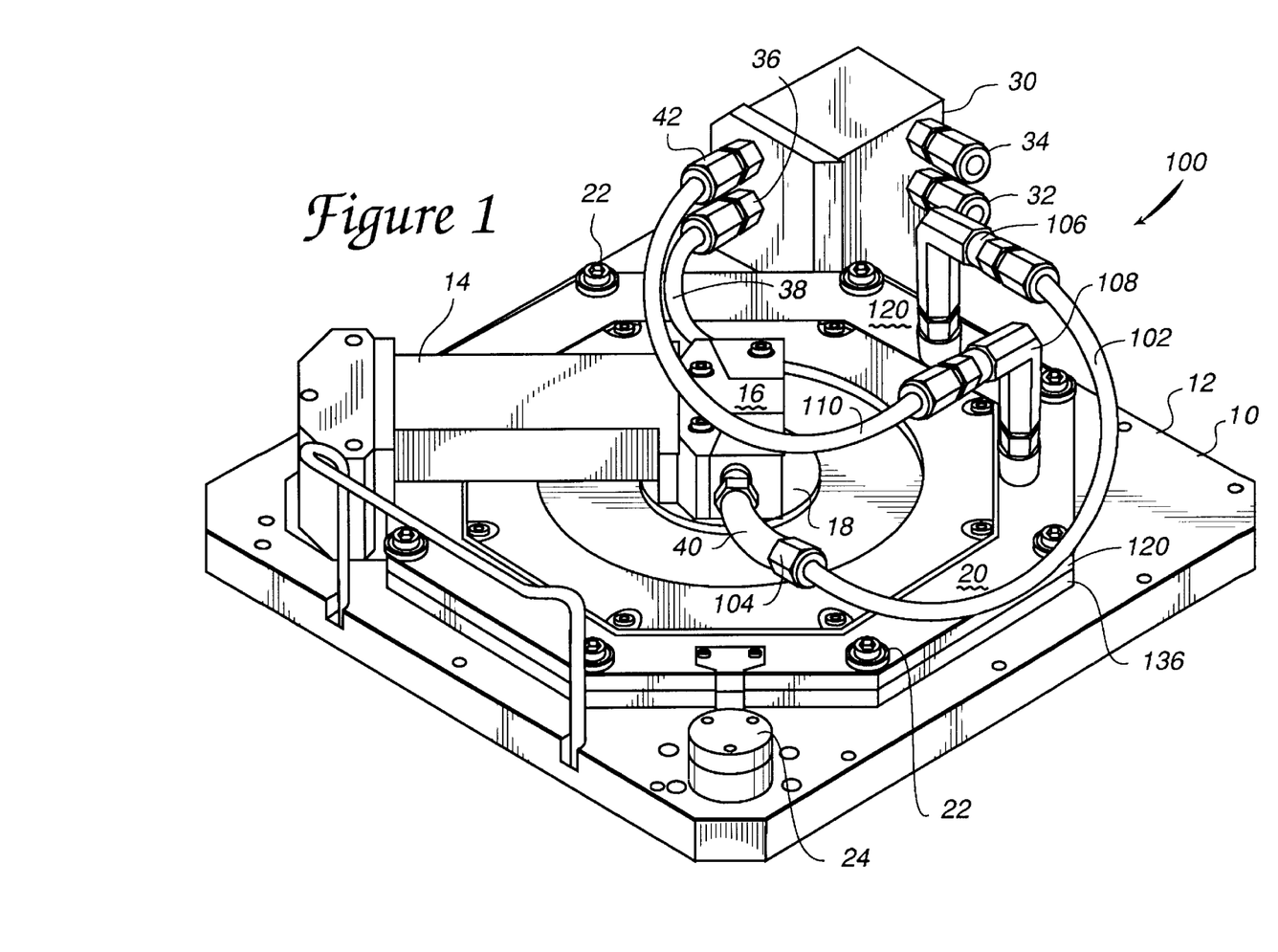
FIG. 1 is a perspective view of the lid portion of a CVD chamber which includes the temperature controlled gas distribution plate of the present invention therewithin.

A lid or cover 10 for a chemical vapor deposition (CVD) chamber (not shown) is depicted in FIG. 1. The generalized components of the lid 10 are well known to those skilled in the art, and include a lid base plate 12, a gas injection manifold 14 having a manifold head 16 which injects gas through a gas injection cover plate 18 that is a part of the generalized gas distribution system 20 that is mounted to the base plate 12 utilizing a plurality of mounting bolts 22. An RF feedthrough 24 and a coolant liquid manifold 30 including an inlet port 32 and outlet port 34, are also mounted to the lid base plate 12. The liquid coolant system includes the liquid manifold 30 together with a manifold head outlet port 36, a manifold head input coolant line 38 and a manifold head exhaust coolant line 40. It is therefore to be understood that coolant may be input into the manifold 30 through the inlet port 32 and directed to cool the manifold head 16 by passage through the port 36, input line 38, head 16 and exhaust line 40. It is to be understood that all of the above identified components are prior art and well known to those skilled in the art. It is further known to those knowledgeable of the prior art devices that the manifold head exhaust coolant line 40 would be connected to the manifold return port 42, whereby the coolant liquid from line 40 would be returned to the manifold 30 and outletted through output port 34.

The present invention departs from the prior art device through the inclusion of a liquid coolant system 100 for the gas distribution plate 120. The gas distribution plate coolant system 100 includes an input line 102 which is engaged to the manifold head output line 40 through coupling 104. The input line 102 is engaged to an L-shaped gas distribution plate liquid input coupling 106, whereupon coolant liquid is delivered to the gas distribution plate 120 as is described in detail hereinbelow. The liquid coolant is outletted through an L-shaped liquid outlet coupling 108 and through an outlet line 110 to the manifold return port 42. It is therefore to be understood that through the utilization of the present invention the manifold head coolant liquid has been routed through the gas distribution plate 120 to cool it prior to the return of the coolant liquid to the manifold 30. A more detailed description of the gas distribution plate 120 of the present invention is next presented with the aid of FIG. 2.

Figure 2:
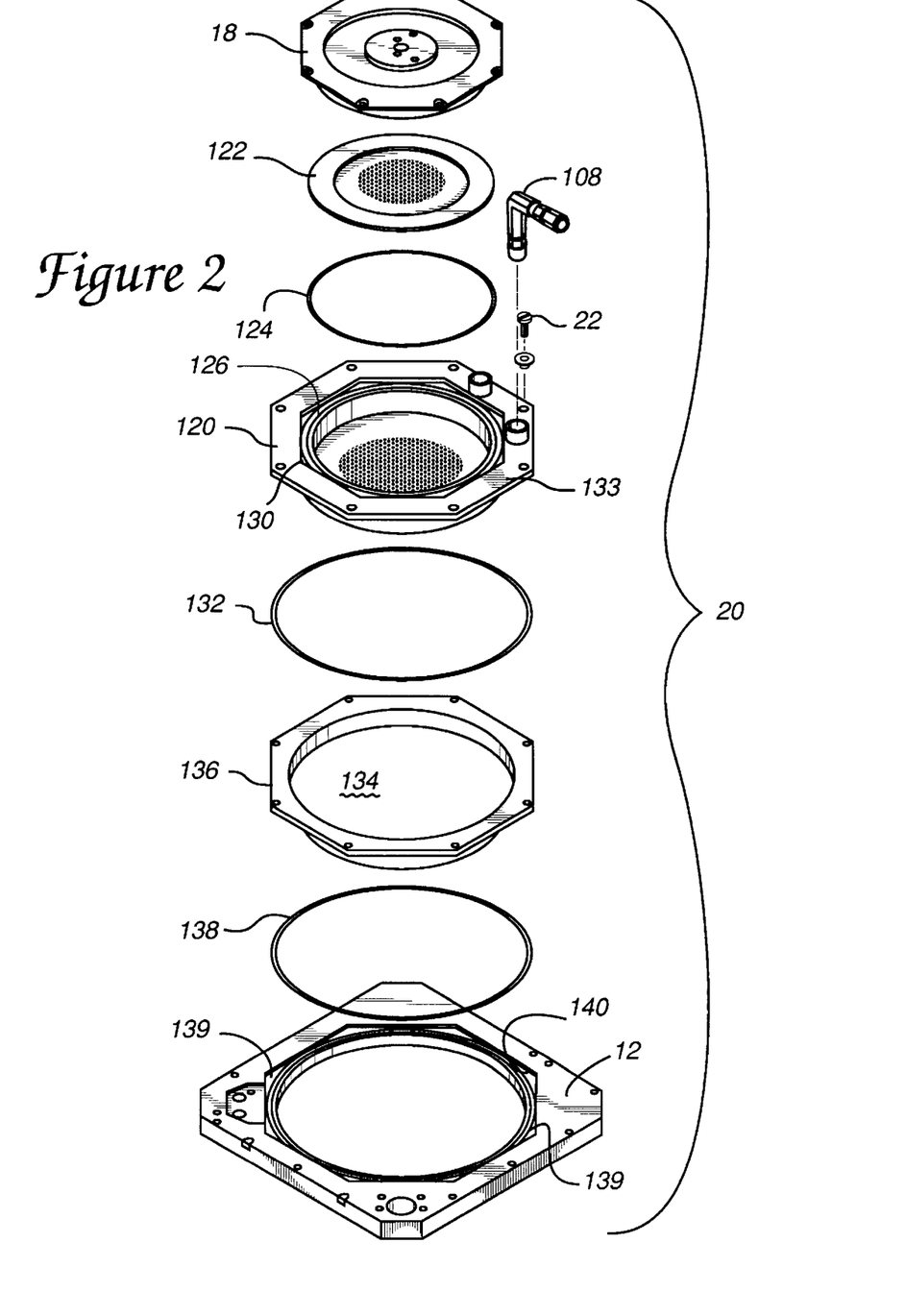
FIG. 2 is a expanded diagram depicting the components of the gas distribution system of the lid depicted in FIG. 1.

FIG. 2 depicts an exploded view of the gas distribution system 20 and base plate 12 of the present invention. As depicted in FIG. 2, the gas distribution system 20 includes a gas injection cover plate 18 below which is mounted a gas dispersion plate 122. The gas injection cover plate 18 and gas dispersion plate 122 are mounted within an octagonally shaped mounting orifice 130 that is centrally formed in the gas distribution plate 120 utilizing an O-ring seal 124 which mounts within an O-ring groove 126. A second O-ring seal 132 resides within an O-ring groove 133 formed in the underside of the gas distribution plate 120, and the gas distribution plate 120 is mounted within a central orifice 134 formed through an RF isolation plate 136. The RF isolation plate 138 is composed of a non-conductor, such as a ceramic or polymer material, to isolate RF power from the grounded base plate 12. Thereafter, utilizing another O-ring 138 which resides within an O-ring groove 139 formed in the base plate 12, the assembled components are mounted and engaged utilizing the bolts 22 into an octagonal recess 140 formed within the base plate 12. It is to be understood that all of the components of the above described gas distribution system 20 are generally known in the prior art, with the sole exception of the liquid cooling features of the gas distribution plate 120. Specifically, it is to be understood that prior art gas distribution systems include a gas distribution plate which functions similarly to gas distribution plate 120, however the prior art gas distribution plates are not provided with the liquid coolant system 100 that comprises the present invention, and which is next described in detail.

Figure 3:
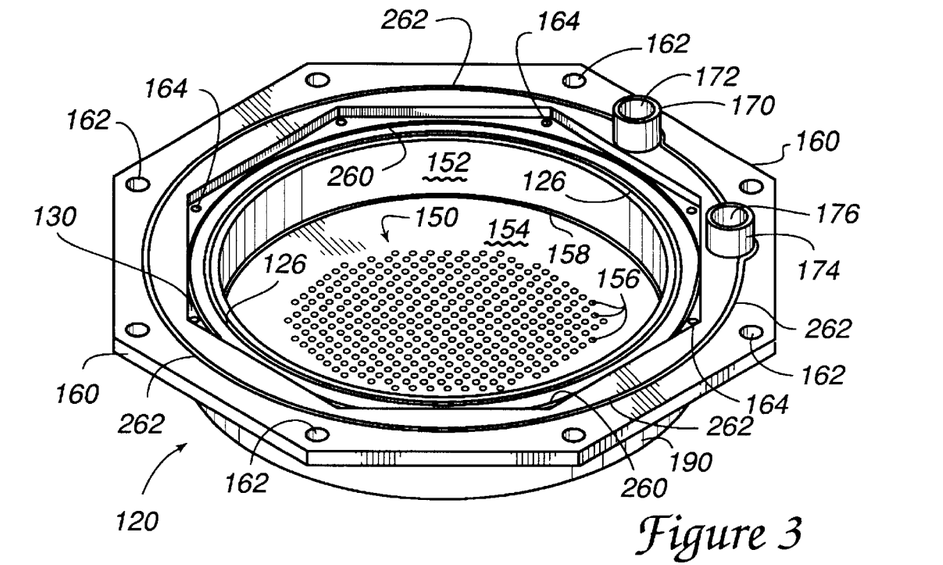
FIG. 3 is a perspective view of the temperature controlled gas distribution plate of the present invention.
Figure 4:
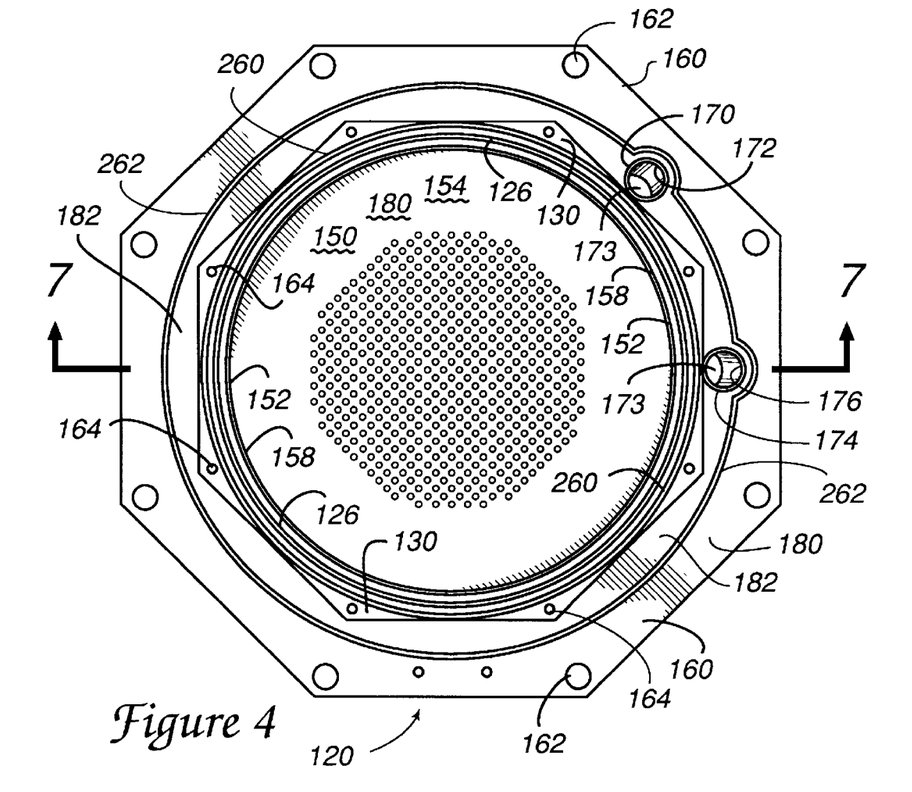
FIG. 4 is a top plan view of the gas distribution plate depicted in FIG. 3.
Figure 5:
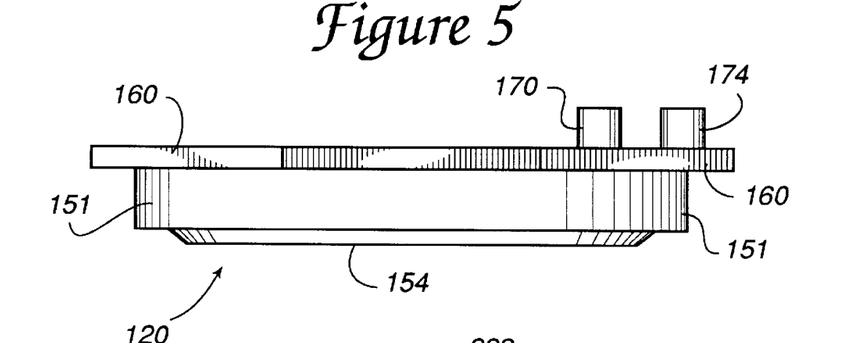
FIG. 5 is a side elevational view of the gas distribution plate depicted in FIG. 4.
Figure 6:
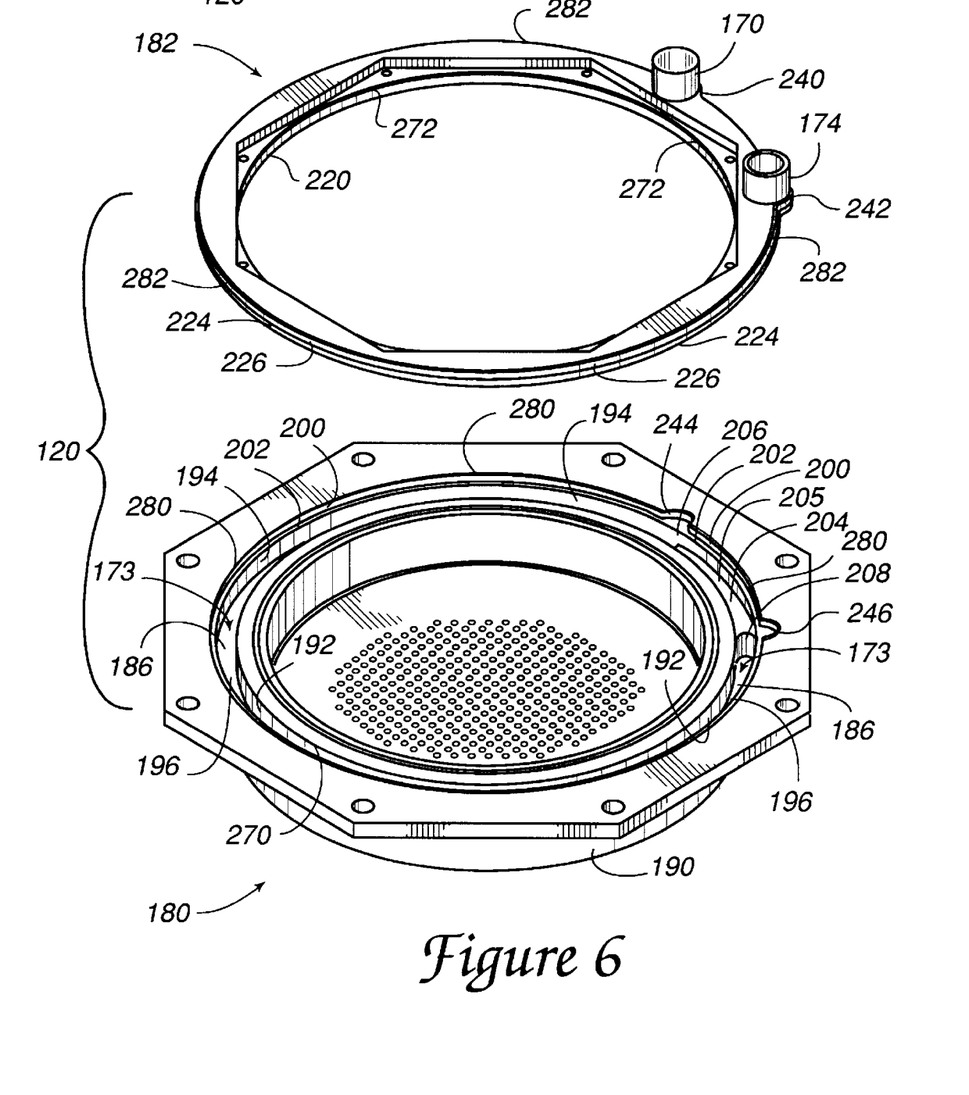
FIG. 6 is a exploded view of the gas distribution plate depicted in FIGS. 3, 4 and 5.
Figure 7:
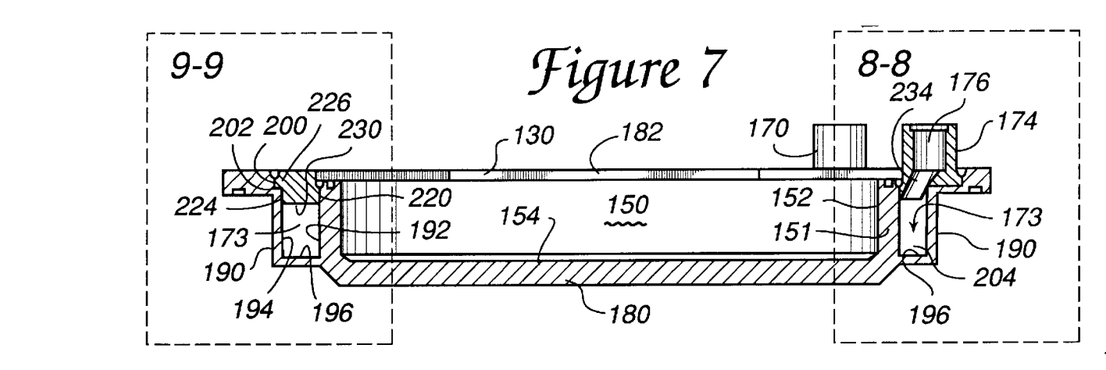
FIG. 7 is a side cross-sectional view of the gas distribution plate, taken along lines 7—7 of FIG. 4.

The temperature controlled gas distribution plate 120 of the present invention is depicted in FIGS. 3, 4, 5, 6 and 7, wherein FIG. 3 is a perspective view of the gas distribution plate 120, FIG. 4 is a top plan view, FIG. 5 is a side elevational view, FIG. 6 is an exploded perspective view and FIG. 7 is a side cross-sectional view taken along lines 7—7 of FIG. 4. The gas distribution plate 120 is a dish-shaped device having a circular, centrally disposed cavity 150 defined by a side wall 151 having an inner side wall surface 152 and a base wall 154 through which are formed a plurality of gas distribution holes 156. A beveled lower wall portion 158 joins the side wall 151 with the base wall 154. A flange portion 160 of the plate 120 projects outwardly in a horizontal plane from the upper portions of the plate 120. The flange 160 serves to provide engagement of the plate 120 with the base plate 12, and a plurality of base plate engagement holes 162 are formed through the edge portions of the flange 160 to facilitate its engagement utilizing the engagement bolts 22 previously identified. A gas injection plate depression 130 is formed in the upper surface of the plate 120 to facilitate the mounting of the gas injection cover plate 18 upon the plate 120, and an O-ring groove 126 is formed within the depression 130 to provide a leak-proof gas seal utilizing the O-ring 124. In the preferred embodiment, the depression 130 is octagonal in shape, as is the flange 160, and a plurality of threaded mounting holes 164 are formed in the depression 130 to facilitate the bolting of the cover plate 18 therewithin.

A cylindrical coolant liquid inlet fitting 170 projects upwardly from the upper surface of the plate 120. The fitting 170 includes a coolant liquid bore 172 formed therethrough for the inletting of coolant liquid into a coolant liquid passage 173 formed within the plate 120. A coolant liquid outlet fitting 174 projects upwardly from the upper surface of the plate 20, which outlet fitting 174 includes an outlet bore 176 formed therethrough in communication with the internal coolant liquid passage 173 to provide an outlet for the coolant liquid. It is to be understood that the L-shaped inlet coupling 106 is sealingly engaged, such as by welding, to the inlet fitting 170 and the L-shaped outlet coupling 108 is likewise sealingly engaged to the outlet fitting 174.

As is best seen with the aid of FIGS. 6 and 7, the plate 120 is assembled from two parts, a base part 180 and a liquid passage cover part 182. The base 180 includes a channel portion 186 of the liquid coolant passage 173 which is cut downwardly into the relatively thick side wall 151 of the plate 120 between the inner side wall surface 152 and an outer side wall surface 190. The channel portion 186 of the passage 173 is defined by an inner channel side wall 192, an outer channel side wall 194 and a channel base wall 196. An outwardly projecting shoulder, comprising a vertical shoulder side wall 200 and a horizontal shoulder shelf 202, is cut in the upper portion of the outer side wall 194 to form a seat for the downward insertion of the passage cover 182, as is described below. It is significant to note that the channel 186 is not formed as a complete, annular channel way. Rather, a channel blockage portion 204 having a flat upper surface 205 is positioned between the inlet port area 206 of the channel 186 and the outlet port area 208 of the channel 186, whereby the coolant liquid is prevented (as is described in detail below) from travelling the short arc distance between the inlet port area 206 and the outlet port area 208, and compelled to travel throughout the channel 186.

The passage cover 182 is formed as a generally circular ring-shaped member that is formed to fit downwardly into the upper portion of the channel 186 and to be sealingly engaged to the base 180. The cover 182 includes an inner side wall surface 220 that is formed to closely mate with the inner side wall 192 of the channel 186, and an outer side wall 224 which is formed with an outwardly projecting step 226 that is formed to closely mate with the outer side wall 194 and shoulder side wall 200 of the channel 186. The lower horizontal surface 230 of the cover 182 forms the upper wall of the passage 173 when the cover 182 is engaged within the base 180. The surface 230 projects downwardly into the channel 186 a sufficient distance to closely mate with the upper surface 205 of the blockage portion 204 of the channel 186, whereby the liquid coolant is prevented from traveling the short arc distance between the inlet area 206 and the outlet area 208 of the passage 186. Coolant liquid communication bores 234 are formed through the cover 182 at the locations of the inlet bore 172 and outlet bore 176 to permit the inletting and outletting of liquid coolant through the cover 182. Owing to the diameter of the inlet fitting 170 and outlet fitting 174, the cover 182 is formed with corresponding horizontally outwardly projecting portions 240 and 242. Corresponding thereto, the shoulder shelf 202 in the base 180 is formed with outwardly projecting cutaway segments 244 and 246 respectfully, such that the downward seating of the cover 182 within the base 180 is facilitated.

Figure 8:
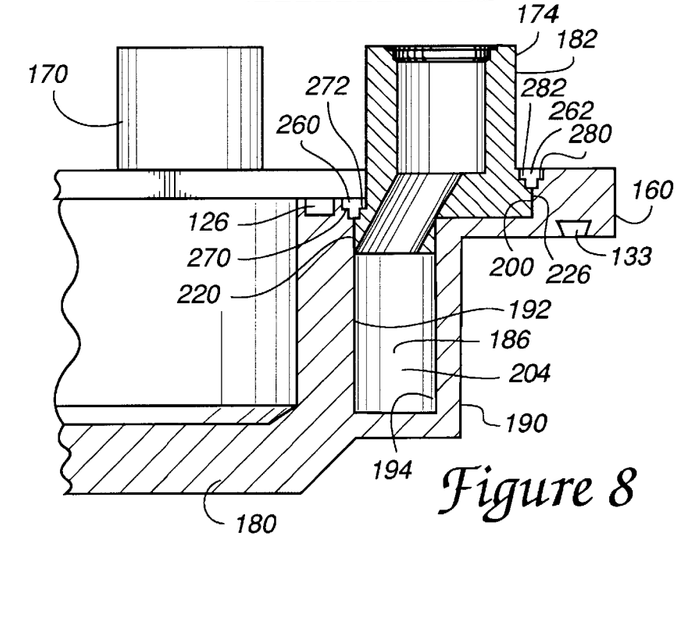
FIG. 8 depicts an enlarged window portion 8—8 of FIG. 7.
Figure 9:
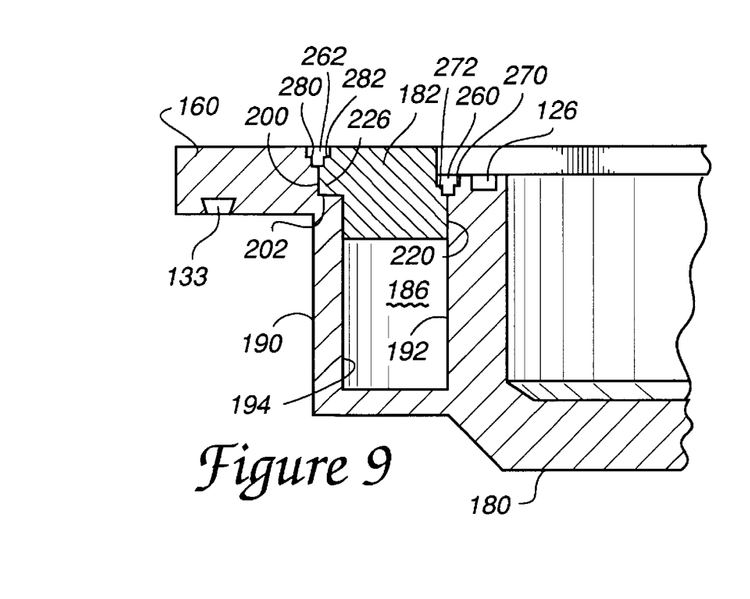
FIG. 9 depicts an enlarged window portion 9—9 of FIG. 7.

FIGS. 8 and 9 provide a detailed depiction of the engagement of the cover 182 within the base 180; it being understood that FIG. 8 is an enlarged view of window portion 8—8 of FIG. 7, and that FIG. 9 is an enlarged view of window portion 9—9 of FIG. 7. As depicted in FIG. 8, the cover 180 is engaged within the base 182 through the formation of an inner weldment groove 260 that is utilized to join and seal the inner seam between the inner side wall 192 of channel 186 and the inner side wall 220 of the cover plate 182, and an outer weldment groove 262 that forms a seal between the shoulder side wall 200 and the outer edge 226 of the cover plate 182. The inner weldment groove 260 is formed by the cooperation of a cutaway shoulder 270 formed at the upper corner of the inner side wall 192 of the channel 186 and a cutaway shoulder 272 formed at the upper corner of the inner side wall 220 of the cover plate 182. The outer weldment groove 262 is formed by the cooperation of a cutaway shoulder 280 formed at the upper corner of the shoulder side wall 200 and a cutaway shoulder 280 formed at the upper corner of the side edge 226 of the cover plate 182.

It is therefore to be understood that the cover plate 182 is to be inserted into the upper portion of the liquid coolant channel 186 of the base 180 until it is seated upon shelf 202; it is then sealingly welded into place through welding throughout the inner and outer weldment grooves 160 and 162 respectfully. The engagement of the plate 182 thereby serves to create an enclosed liquid coolant passage 173 throughout the side walls 151 of the gas distribution plate 120, whereby the temperature of the gas distribution plate 120 may be controlled by controlling the temperature of the liquid that is caused to pass through the passage 173.

The present invention is useful where the temperature control of the gas distribution plate in a CVD system is important. It is particularly useful in the deposition of tungsten silicide upon a wafer surface. In the deposition of tungsten silicide, two gases, tungsten hexafluoride and silane are mixed in the cooled gas manifold head 16. The gas mixture is then passed through the gas distribution system 20 to impinge upon a wafer within the CVD chamber. It is known that the two gases will react at surfaces whose temperature is greater than approximately 25 degrees centigrade to form tungsten silicide. Thus, the wafer is held at a temperature that is greater than 25 degrees centigrade, whereas the manifold head 16 is cooled by a liquid coolant to a temperature that is less than 25 degrees centigrade. The utilization of the present invention prevents the gas distribution plate 120 from achieving a temperature that is greater than 25 degrees centigrade, whereby the gaseous mixture is inhibited from reacting at the gas distribution plate 120 to form a tungsten silicide film. Such a tungsten silicide film formation on prior art gas distribution plates has caused clogging of the plate holes as well as the flaking of particulates which cause contamination of the wafer within the chamber. The present invention thereby increases the efficiency of the CVD process. The temperature controlled gas distribution plate 120 of the present invention is fabricated to be engaged to a base plate 12 with the same external dimensions as the prior art base plates, whereby the device 10 may be retrofit into existing CVD systems. With the simple interconnection of the device into the preexisting liquid coolant system, the operation of the invention is achieved and the benefits therefrom are obtained.

While the invention has been particularly shown and described with reference to certain preferred embodiments, it will be understood by those skilled in the art that various alterations and modifications in form and detail may be made therein. Accordingly, it is intended that the following claims cover all such alterations and modifications as may fall within the true spirit and scope of the invention.

We claim:

1. An apparatus, comprising:
   a chemical vapor deposition chamber;
   a gas injection cover member having a process gas inlet in communication with said chemical vapor deposition chamber and a coolant system configured to cool said process gas inlet;
   a gas distribution plate interconnected to said gas injection cover member and including:
      a plate member having at least one gas distribution hole therethrough configured to permit process gas to pass therethrough, said plate member formed from a base part and a cover plate part;
      a liquid coolant passage being formed as a channel disposed in said base part to permit the movement of a coolant liquid therethrough, and said cover plate part being fixedly engaged to said base part to form a sealed cover to said channel, whereby said liquid coolant passage is formed within said plate member;
      a liquid inlet being engaged to said plate member and communicating with said liquid coolant passage; and
      a liquid outlet being engaged to said plate member and communicating with said liquid coolant passage.

2. An apparatus as described in claim 1 wherein said liquid inlet is engaged to said cover plate part and said liquid outlet is engaged to said cover plate part.

* * * * *

UNITED STATES PATENT AND TRADEMARK OFFICE
CERTIFICATE OF CORRECTION

PATENT NO. : 6,379,466 B1
DATED : April 30, 2002
INVENTOR(S) : Sahin et al.

It is certified that error appears in the above-identified patent and that said Letters Patent is hereby corrected as shown below:

Column 3,
Line 36, please change "plate 138" to -- plate 136 --.

Signed and Sealed this

Thirty-first Day of December, 2002

JAMES E. ROGAN
*Director of the United States Patent and Trademark Office*